United States Patent
Maag et al.

(10) Patent No.: US 10,778,172 B2
(45) Date of Patent: Sep. 15, 2020

(54) AUDIO COMPRESSOR WITH PARALLEL EQUALIZER CIRCUIT

(71) Applicants: Clifford Maag, Provo, UT (US); Travis Allen, Orem, UT (US)

(72) Inventors: Clifford Maag, Provo, UT (US); Travis Allen, Orem, UT (US)

(*) Notice: Subject to any disclaimer, the term of this patent is extended or adjusted under 35 U.S.C. 154(b) by 0 days.

(21) Appl. No.: 15/917,578

(22) Filed: Mar. 10, 2018

(65) Prior Publication Data

US 2018/0262176 A1  Sep. 13, 2018

Related U.S. Application Data

(60) Provisional application No. 62/469,523, filed on Mar. 10, 2017.

(51) Int. Cl.

| | | |
|---|---|---|
| *H03G 5/16* | (2006.01) | |
| *H03G 5/00* | (2006.01) | |
| *H03G 9/00* | (2006.01) | |
| *H03G 9/02* | (2006.01) | |
| *H04R 25/00* | (2006.01) | |

(52) U.S. Cl.
CPC .............. *H03G 5/165* (2013.01); *H03G 5/005* (2013.01); *H03G 9/005* (2013.01); *H03G 9/025* (2013.01); *H04R 25/505* (2013.01); *H04R 25/70* (2013.01)

(58) Field of Classification Search
CPC ........ H03G 5/165; H03G 5/005; H03G 5/025; H03G 7/00
See application file for complete search history.

(56) References Cited

U.S. PATENT DOCUMENTS

| | | | | |
|---|---|---|---|---|
| 3,700,811 A | * | 10/1972 | Davidson | H03G 5/10 333/28 T |
| 4,837,832 A | * | 6/1989 | Fanshel | H03G 9/18 381/105 |
| 5,748,754 A | * | 5/1998 | Maag | H03G 5/025 381/104 |
| 5,805,716 A | | 9/1998 | Maag et al. | |
| 6,885,752 B1 | * | 4/2005 | Chabries | H03G 9/005 381/106 |
| 2011/0235824 A1 | * | 9/2011 | Lehnert | H03G 9/005 381/94.8 |
| 2017/0111020 A1 | * | 4/2017 | Song | H03G 5/165 |

\* cited by examiner

*Primary Examiner* — James K Mooney
(74) *Attorney, Agent, or Firm* — Brett A. Hansen

(57) ABSTRACT

An audio equalizer circuit for controlling and modifying an audio signal includes a signal divider positioned to receive an audio signal from an audio source. The divided audio signal is then passed through multiple bandpass filters situated in parallel with one another. One or more of the bandpass filters includes a compressor in order to limit the dynamic range of the audio source. After the compressor, the audio circuit may include two summation circuits with the second compressor interposed between the two.

18 Claims, 3 Drawing Sheets

AUDIO COMPRESSOR WITH PARALLEL EQUALIZER CIRCUIT

RELATED APPLICATION

This application claims the benefit of U.S. Provisional Patent Application No. 62/469,523, which was filed on Mar. 10, 2017 and entitled "Audio Compressor with Parallel Equalizer Circuit," the entire contents of which are incorporated herein by reference in its entirety.

FIELD OF THE INVENTION

The invention relates generally to the field of audio dynamics and filtering equipment. More specifically, the invention relates to an improved audio compressor and parallel equalizer apparatus for modifying specific audio dynamics and frequencies.

BACKGROUND

Audio mixing is an extremely important part of the music creation and recording process. Many different vocals and instruments are mixed together to create a single work. Each instrument and audio track has various dynamics and frequency ranges that are combined to create the final piece in the mixing and recording process. Different sounds can be amplified or reduced in order to create the final piece. To do so, filtering equipment, such as graphic equalizers, have been developed that allow mixers to increase or decrease the amplitude of different frequencies of the audio track. For example, a saxophone will have different frequency ranges than will vocals. By adjusting the amplitude of the frequencies through which the different audio signals pass, the overall sound of the song will be changed. Such equalizer designs are disclosed in U.S. Pat. Nos. 5,805,716 and 5,748,754, both of which are incorporated herein by reference.

While audio mixing has been around for many years, there are some limitations as to how much of the song can be changed without degrading the overall quality of the audio signal. Vocals and other audio signals in the 2.5 kHz band range can be harsh to the human ear and may need to be compressed dynamically to create a strong, but not overpowering sound.

Therefore, what is needed is a low phase shift equalization circuit and design that allows high-frequency sounds to be compressed independently of other frequencies.

SUMMARY OF THE INVENTION

The present disclosure relates to an audio equalizer circuit for controlling and modifying an audio signal. The circuit comprises an audio signal input and a signal divider that is positioned to receive an audio signal from the audio signal input. The circuit includes a first bandpass kilter electrically coupled to the signal divider to receive at least a portion of the signal. The first bandpass filter is configured to pass a centerline band of a first frequency. There is further a second bandpass filter electrically coupled to the signal divider to receive at least a portion of the signal. The second bandpass filter is in parallel with the first bandpass filter. The second bandpass filter is configured to pass a centerline band of a second frequency and the second frequency is different than the first frequency. The circuit additionally has a compressor that is controllably coupled to the first bandpass falter for modifying a characteristic of a portion of the signal passing through the first bandpass filter. The compressor, in one embodiment, is not controllably coupled to the second bandpass filter. The circuit includes a summation circuit coupled to the first bandpass filter and the second bandpass filter to receive and combine the portions of the signal from the first bandpass filter and the second bandpass filter.

The audio equalizer circuit may be configured such that the first bandpass filter has a centerline band of about 2.5K Hz. Moreover, the first bandpass filter, the second bandpass filter, the compressor, and the summation circuit may be located within a single housing. The circuit may further comprise a second compressor coupled to and receiving the audio signal from the summation circuit. The second compressor of the circuit may include a governor switch. This governor switch may have at least two limit switches. The audio equalizer may further comprise a limiter control positioned to receive the audio signal alter the summation circuit. The audio equalizer circuit may shunt a portion of the signal passing through the first bandpass filter.

The audio equalizer may also include a third bandpass filter electrically coupled to the signal divider to receive at least a portion of the signal. The third bandpass filter may be configured to pass a centerline band of a third frequency. The equalizer may include a fourth bandpass filter electrically coupled to the signal divider to receive at least a portion of the signal. The fourth bandpass filter may be configured to pass a centerline band of a fourth frequency. The equalizer may have a fifth bandpass filter electrically coupled to the signal divider to receive at least a portion of the signal. The fifth bandpass filter may be configured to pass a centerline band of a fifth frequency. In one embodiment the first through the fifth frequencies are different than the other frequencies and each of the bandpass filters is parallel to the other bandpass filters.

The present disclosure also relates to a compressor with parallel equalizer circuits for controlling and modifying an audio signal. The circuit may include an audio input and a plurality of parallel bandpass filters each having a different bandpass frequency range and the filters being in communication with the audio input. There is a first compressor associated with one of the plurality bandpass filters and in parallel with the other of the plurality of parallel bandpass filters. A first summation amplifier may be positioned to receive a first subset of the plurality of parallel bandpass filters including the bandpass filter associated with the first compressor. There may also be a second compressor positioned to receive an input from the first summation amplifier and in series with the first compressor. There is a second summation amplifier that receives inputs from the first subset of the plurality of parallel bandpass filters and a second subset of the plurality of parallel bandpass filters.

The compressor may be associated with a 2.5K Hz bandpass. The first subset of plurality of bandpass filters may include biters ranging from 10 Hz to 2.5 K Hz. In the equalizer, the plurality of parallel bandpass filters, the first compressor, the first summation amplifier, the second compressor, and the second summation amplifier may be located within a single housing. The second compressor may include a governor switch which may have at least two limit switches.

The disclosure also provides a method for digitally controlling and modifying an audio signal through software. This method comprises the step of receiving an initial digital audio input. The next step is dividing the initial digital audio input into a plurality of frequencies. The following step is providing controls to modify the magnitude of the divided digital audio frequencies. Then the step of independently compressing at least one of the divided audio frequencies separately from the remaining divided digital audio frequencies. Finally, the step of summing at least a first portion of the divided digital audio frequencies of the initial digital audio circuit such that the summed signal is different than the initial digital audio.

In the method, the computing device may be a personal computer. The method my also include the step of compressing the summed audio signal. It may also include the step of receiving and summing a second portion of the divided digital audio. The method may additionally include the step of outputting a modified embodiment of the initial digital audio input.

BRIEF DESCRIPTION OF THE DRAWING

The foregoing discussion will be understood more readily from the following detailed description of the invention when taken in conjunction with the accompanying drawings.

DETAILED DESCRIPTION OF THE DRAWINGS

Figure 1:
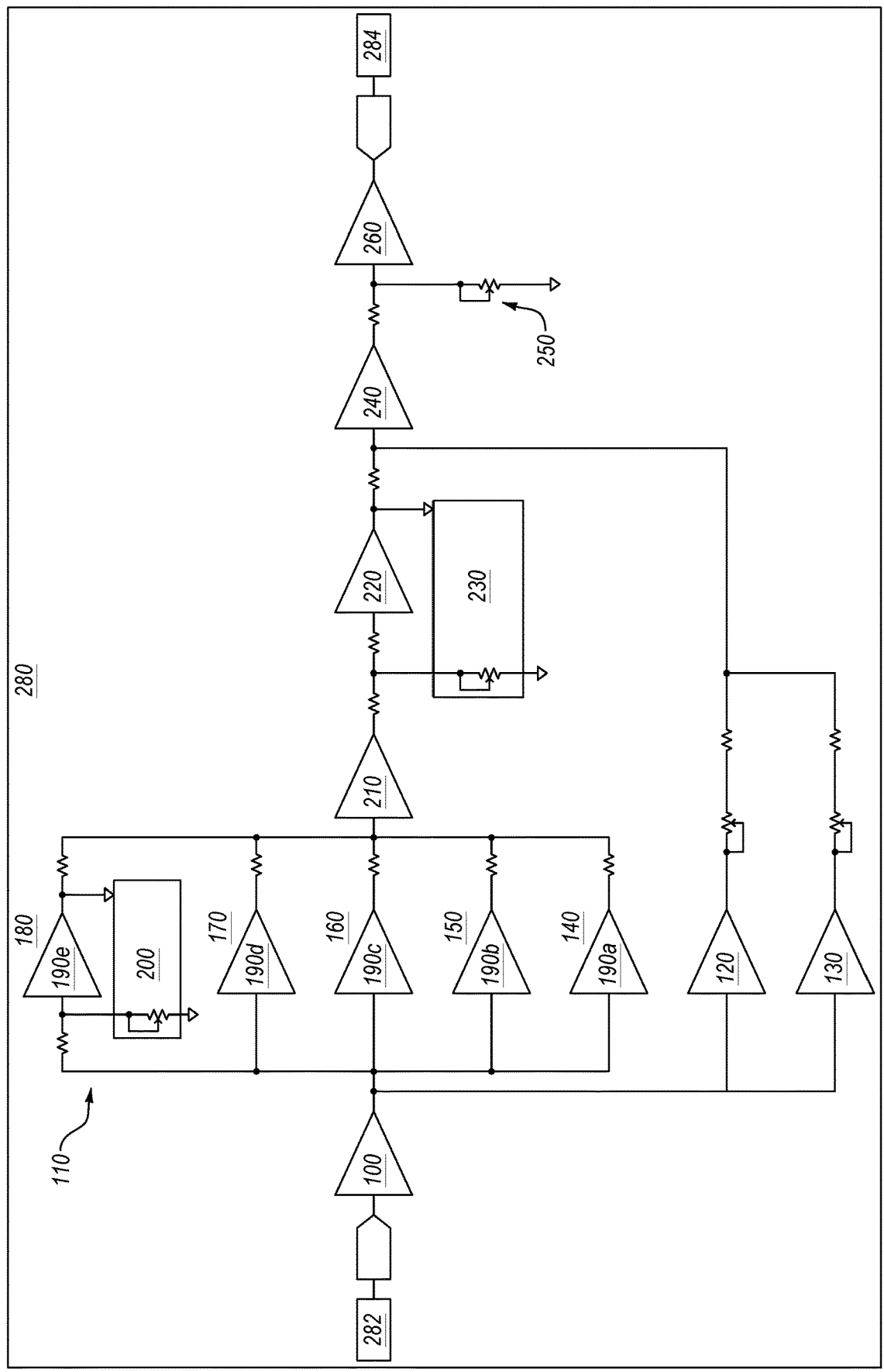
FIG. 1 is a circuit diagram of a parallel equalizer circuit according to one embodiment of the present application.

FIG. 1 is a circuit diagram of one embodiment of the present invention. In this circuit, an audio signal is received by the receiver 100. This signal is then distributed equally to a multiple bandpass filter, such as a five-bandpass filter, with focused 2.5 kHz compression control 200, a low/mid frequency parallel equalizer 120, and a high-frequency parallel equalizer 130. The splitting of the audio signal to the three different frequency sections 110, 120, 130 gives the operator/mixer control over the amplitude of the signals across these broad frequency ranges. Turning solely to the multiple bandpass filter with focused 2.5 kHz compression control section 200, the signal received from the receiver 100 is split into multiple different frequency ranges, such as a 10 Hz band 140, a 40 Hz band 150, a 160 Hz band 160, a 640 Hz band 170, and a 2.5 kHz band 180. Each of these bands 140, 150, 160, 170, 180 includes a bandpass filter 190a-e. As used herein, frequency may not refer to a single frequency, but rather a centerline frequency where all other frequencies, as they diverge from the centerline frequency, are shunted to ground. Thus, reference to a specific frequency herein may include a range of frequencies generally centered about a recited frequency.

The bandpass filter 190a-d allow the designated centerline frequency to freely pass through the bandpass filters 190a-d, while in the bandpass filter 190e the focused 2.5 kHz compression control 200 can be adjusted by the operator/mixer. Once the audio signal from the receiver 100 is broken into the different frequency bands 140, 150, 160, 170, 180, the operator/mixer can control the 2.5 kHz band 180 by using the focused 2.5 kHz compression control 200. In the embodiment shown in FIG. 1, this is represented as a focused 2.5 kHz compression control 200 located on the 2.5 kHz band 180 frequency in addition to the bandpass filter 190e. The focused 2.5 kHz compression control 200 permits the high and low amplitudes of the 2.5 kHz audio signal to be shunted, selectively compressing the amplitude of the audio wave. This shunting limits the dynamic range of the signal, thus providing a unique control of certain high frequency sounds.

While the focused 2.5 kHz compression control 200 is uniquely placed on the equalizer circuit, its design is one that is known to those of ordinary skill in the art. The focused 2.5 kHz compression control 200 may consist of a photo resistor type compressor which shunts a portion of the audio signal to ground depending upon the amount of compression selected by the operator/mixer. Alternatively, the compression control may be variable-mu compressor, FET compressor, VCA compressor. Thus, with the configuration shown in FIG. 1, an operator may limit the dynamic range of the audio signal at 2.5 kHz 180 separately from the other band frequencies 140, 150, 160, 170.

Once the audio signal has been processed by the band pass filters 190a-e, the discrete frequency signals are combined together by the summation amplifier 210. The summation amplifier 210 re-combines the distinct frequency signals into larger frequency signal ranges while also including the modifications made to the signal by the bandpass filters 190a-e and the focused 2.5 kHz compression control 200.

After the discrete frequencies are summed together by the summation amplifier 210, the signal is passed through a buffer amplifier 220 which includes, in one embodiment, a full band compressor 230. The full band compressor 230 may function similarly to the focused 2.5 kHz compression control 200 accepting that it is compressing the dynamic range of all of the frequencies (10 Hz through 2.5 kHz) received into the five-bandpass filter with focused 2.5 kHz compression control section 200. The full band compressor 230 may be a photo resistor, similar to that of the focused 2.5 kHz compression control 200, though other compressors are known to those of ordinary skill in the art. With the addition of the second compressor 230, this compressor with a parallel equalizer circuit has two compressors 200, 230 in series. The amplitude of the full band width signal is controlled by the second compressor 230 which allows selectable portion of the signal to be shunted to ground thereby providing dynamic control of the full bandwidth.

The full band compressor may also include governor control switches that determine the maximum amount of compression that can take place depending upon a selected switch position. This switch may be positioned at 4 dB, 8 dB, 12 dB, or 16 dB. Thus, when the switch is set to 4 dB, the compressor 230 will not compress more than 4 dB in order to provide regulation to the amount of compression applied to the wide hand of frequencies. The same compression apply at 8 dB, 12 dB, or 16 dB respectively.

After the full band compressor 230, the signals from the low/mid frequency parallel equalizer 120 and the high-frequency parallel equalizer 130 are combined with the output of the full band compressor 230 by a second summation amplifier 240. At this stage, all frequencies originally receive from the receiver 100 are fully combined, though in their modified state. Once the second summation step is completed, a soft limiter control 250 may be present as well as a second buffer amplifier 260. After the second buffer amplifier 260, the audio signal is output.

All of the components shown in FIG. 1 may be located within a single housing 280. The housing may have an input 282 and an output 284. The equalizer may have a multi-bandpass filter 140, 150, 160, 170, 180 with a focused 2.5 hHz compressor 200. The equalizer may further have a full hand compressor circuit 230 which compresses the three different equalizer circuits 110, 120, 130. In this configuration, once the signal five-bandpass filter passes through the summation amplifier 210, the second equalizer circuit 120 and third equalizer circuit 130 may be combined by a second summation amplifier 240 and combined into a modified signal that passes throw a soft limiter or control to the output.

Figure 2:
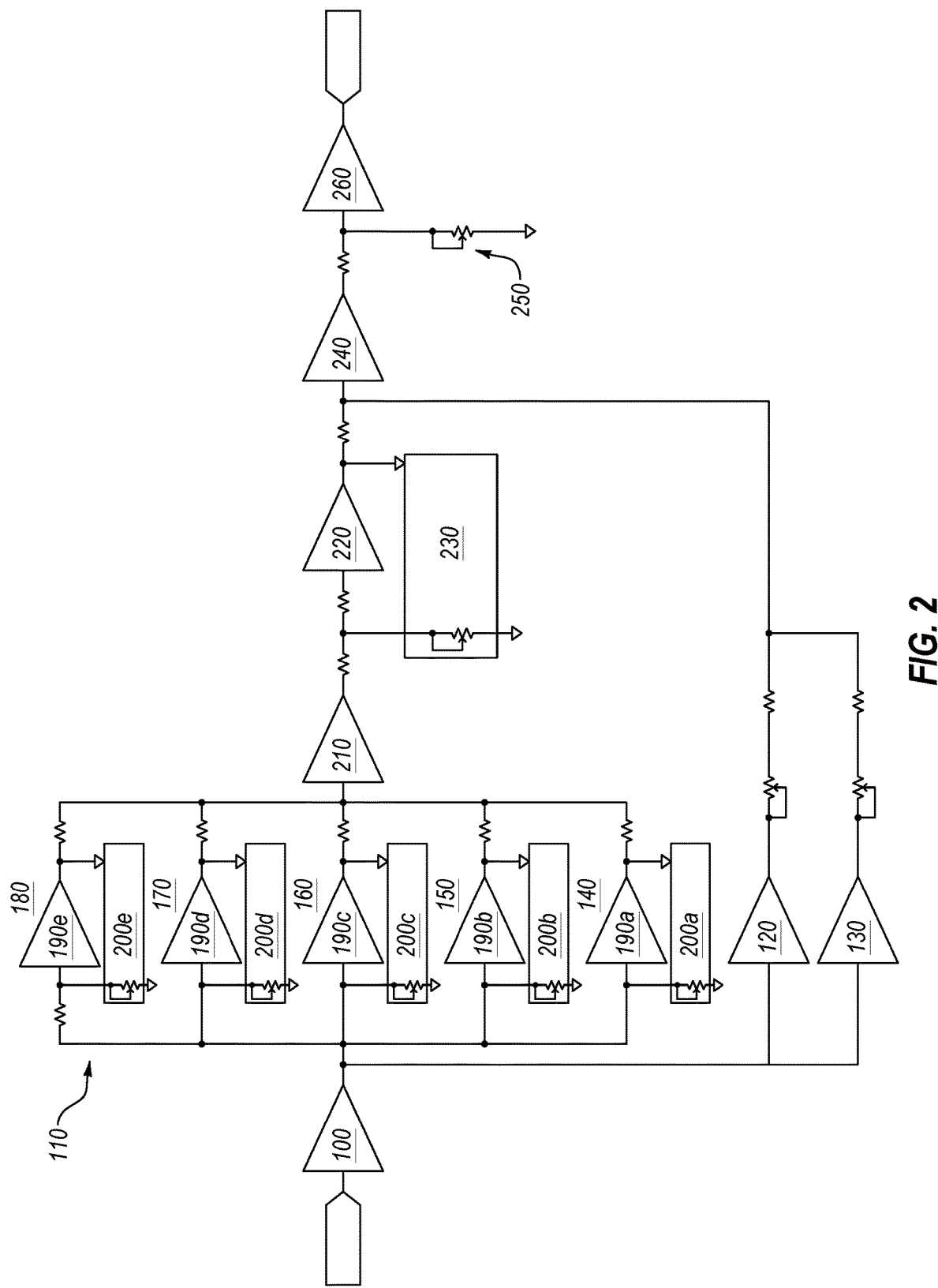
FIG. 2 is a circuit diagram of a parallel equalizer circuit according to another embodiment of the present application.

In an alternative embodiment shown in FIG. 2, one or more compressors may be added to the other frequency bands, such as one or more of the 10 Hz band 140, the 40 Hz band 150, the 160 Hz band 160, or the 640 Hz band 170. In such an embodiment the audio signal is received by receiver 100 after which a signal divider separates the signal into multiple parallel signals which splits and directs the signals to different equalizers 110, 120, 130. In one or more of the equalizer channels, there may be a plurality of bandpass filters 140, 150, 160, 170, 180 each having a different pass-through frequency (e.g., 2.5K Hz, 640 Hz, 160 Hz, 40 Hz, 10 Hz). In the embodiment of FIG. 2, each of the bandpass filters of the first equalizer 110 may include its own compressor. For example, the 2.5K Hz filter 180 may include a 2.5K Hz compressor control 200e, the 640 Hz filter 170 may include a 640 Hz compression control 200d, the 160 Hz filter 160 may include a 160 Hz compression control 200c, the 40 Hz filter 150 may include a 40 Hz compression control 200b, and the 10 Hz filter 140 includes a 10 Hz compression control 200a. Depending upon the application, this may provide additional controls for the operator.

After the audio signal is modified by the one or more of the compression controls 200a-e, the other signals are combined by the first summation amplifier 210 after which the full band of the first equalizer circuit 110 may be further modified by a full band compression range control 230. Next, a second summation circuit 240 may combine the signals from the first equalizer 110, the second equalizer 120, and the third equalizer 130. And a buffer amplifier 260 and soft limiter control 250 may be present after the second summation circuit 240.

Figure 3:
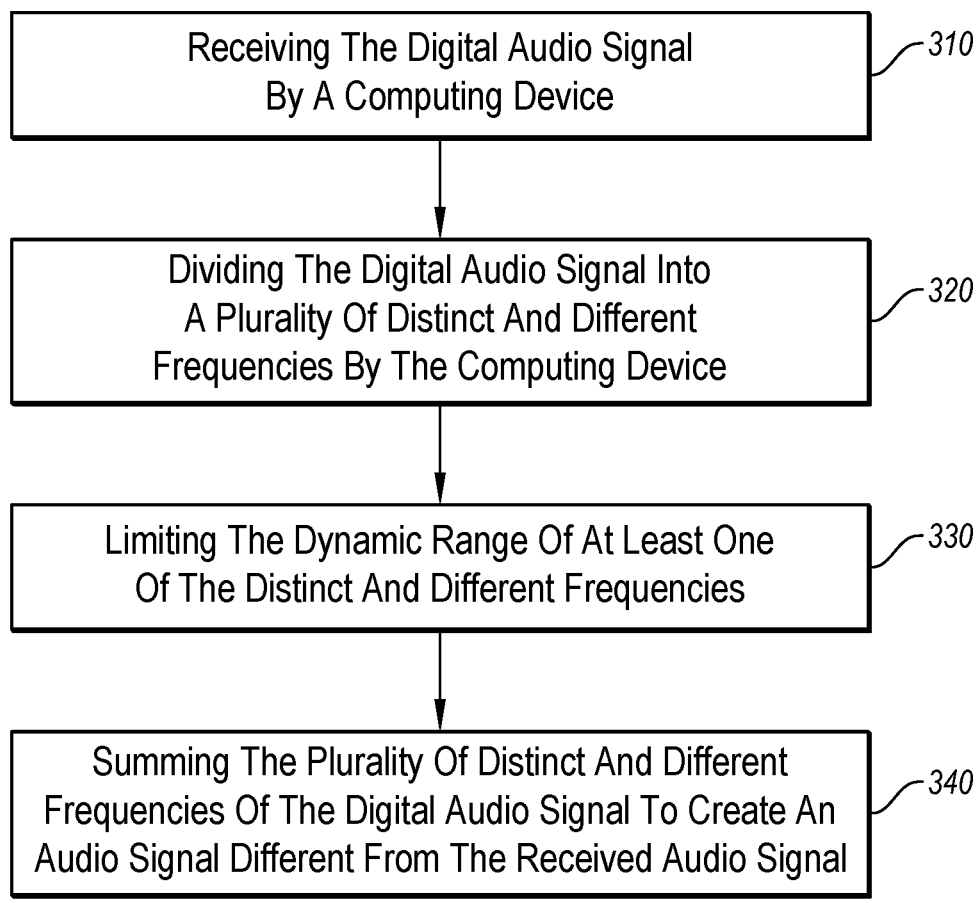
FIG. 3 is a flow chart as digital embodiment of the circuit disclosed herein.

While the embodiments above shown in FIGS. 1 & 2 illustrate a circuit version of this concept, the use of the compressor on a specific frequency such as 2.5 kHz, a full band compressor in series, and parallel equalization circuits for low/mid and high frequencies, can also be accomplished digitally. Referring now to FIG. 3, in the digital embodiment, a computing device with a compressor emulator or other software could be implemented. In such an embodiment, the computing device would receive the digital audio signal 310. The computing device would then divide the audio signal into different and distinct frequencies that may be individually modified 320. These divided frequencies may include a first, a second, and a third frequency groups, such as a low, a mid, and a high frequency group. One of these frequency groups may be further divided into different frequencies such as a 10 Hz band, a 40 Hz band, a 160 Hz band, a 640 Hz band, and a 2.5K Hz band.

Once the digital audio signal is divided into the different frequencies, the user may be provided virtual controls for modifying the magnitude or the sound characteristics of any one of the frequencies, such as the 2.5K Hz band. With this control, the user may limit the dynamic range of one of the different and distinct frequencies 330 using a virtual compressor control. The computing device could be programmed to modify the 2.5 kHz band in a manner that limits its dynamic range. In another embodiment, one or more of the 10 Hz hand, a 40 Hz band, a 160 Hz band, a 640 Hz band frequencies may be modified, such that compression of one frequency band does not impact the other frequency bands. Once the computing device modifies the desired frequency, all other frequency ranges may be summed together to create an audio signal different from the audio signal originally received into the computing device 340. The computing device may be programmed to include a second virtual compressor to modify two or more summed frequencies prior to summing all frequencies that were derived from the original signal. Likewise, a digital compressor with 4 dB, 8 dB, 12 dB, or 16 dB switches may also be programmed.

While the invention has been particularly shown and described with reference to specific preferred embodiments, it should be understood by those skilled in the art that various changes in form and detail may be made therein without departing from the spirit and scope of the invention as defined by the claims. As the present invention has described audio equalizers and mixing equipment, such designs may be used in other audio equipment where the audio signal needs to be modified, such as in hearing aids or other audio products, known to those of ordinary skill in the art.

What is claimed is:

1. An audio equalizer circuit for controlling and modifying an audio signal, the circuit comprising:
   an audio signal input;
   an signal divider positioned to receive an audio signal from the audio signal input and to split the input signal into a first signal, a second signal, and a third signal;
   a multiple bandpass filter positioned to receive the first signal, the multiple pass filter having a first bandpass filter and a second bandpass filter,
   the first bandpass filter electrically coupled to the signal divider to receive at least a first portion of the first signal, the first bandpass filter configured to pass a centerline band of a first frequency; and
   the second bandpass filter electrically coupled to the signal divider to receive at least a second portion of the first signal, the second bandpass filter in parallel with the first bandpass filter, the second bandpass filter configured to pass a centerline band of a second frequency which is different than the first frequency;
   a first compressor controllably coupled to the first bandpass filter for modifying a characteristic of the first portion of the first signal passing through the first bandpass filter, wherein the first compressor is not controllably coupled to the second bandpass filter,
   a first summation circuit coupled to the first bandpass filter and the second bandpass filter to receive and combine the first and second portions of the first signal from the first bandpass filter and the second bandpass filter, respectively;
   a second compressor coupled to receive an input from the first summation circuit for modifying a characteristic of the input from the first summation circuit;
   a low frequency equalizer positioned to receive the second signal;
   a high frequency equalizer positioned to receive the third signal; and
   a second summation circuit electrically coupled to the first summation circuit, the low frequency equalizer, and the high frequency equalizer to receive and combine portions of the signals from, the first summation circuit with the second signal and the third signal.

2. The audio equalizer circuit of claim 1 wherein the first bandpass filter has a centerline frequency band of 2.5K Hz.

3. The audio equalizer circuit of claim 1 wherein the first bandpass filter, the second bandpass filter, the low frequency equalizer, high frequency equalizer, the first compressor, the second compressor, the first summation circuit, and the second summation circuit are located within a single housing.

4. The audio equalizer circuit of claim 1 where the second compressor includes a governor switch.

5. The audio equalizer circuit of claim 4 where the governor switch has at least two limit switches.

6. The audio equalizer circuit of claim 1 further comprising a limiter control positioned to receive the audio signal after the second summation circuit.

7. The audio equalizer circuit of claim 1 wherein modifying a characteristic of the first portion of the first signal passing through the first bandpass filter comprises shunting a portion of the signal passing through the first bandpass filter.

8. The audio equalizer circuit of claim 1 further comprising:
a third bandpass filter electrically coupled to the signal divider to receive at least a portion of the first signal, the third bandpass filter configured to pass a centerline band of a third frequency;
a fourth bandpass filter electrically coupled to the signal divider to receive at least a portion of the first signal, the fourth bandpass filter configured to pass a centerline band of a fourth frequency; and
a fifth bandpass filter electrically coupled to the signal divider to receive at least a portion of the first signal, the fifth bandpass filter configured to pass a centerline band of a fifth frequency, wherein each of the first through fifth frequencies is different than the other frequencies and wherein each of the bandpass filters is parallel to the other bandpass filters.

9. The audio equalizer circuit of claim 8 wherein:
the first bandpass filter is a 2.5 k Hz filter;
the second bandpass filter is a 640 Hz filter;
the third bandpass filter is a 160 Hz filter;
the fourth bandpass filter is a 40 Hz filter; and
the fifth bandpass filter is a 10 Hz filter.

10. A compressor with parallel equalizer circuit for controlling and modifying an audio signal, the circuit comprising:
an audio input;
a divider splitting the audio input into at least a first signal, a second signal, and a third signal;
a multiple bandpass filter having a plurality of parallel bandpass filters having different bandpass frequency ranges and the filters being in communication with the divider and receiving the first signal;
a low frequency equalizer receiving the second signal from the divider;
a high frequency equalizer receiving the third signal, the third bandpass filter being parallel to the second bandpass filter, and having a different frequency range from the second bandpass filter;
a first compressor associated with one of the plurality of parallel bandpass filters, but not associated with the others of the plurality of parallel bandpass filters;
a first summation amplifier receiving an input from the plurality of parallel bandpass filters including the bandpass filter associated with the first compressor;
a second compressor positioned to receive an input from the first summation amplifier and in series with the first compressor; and
a second summation amplifier receiving inputs from the second compressor, the low frequency equalizer, and the high frequency equalizer.

11. The audio equalizer circuit of claim 10 wherein the first compressor is associated with a 2.5K Hz bandpass filter.

12. The audio equalizer circuit of claim 10 wherein the plurality of parallel bandpass filters includes filters having centerline frequencies of 10 Hz, 40 Hz, 160 Hz, 640 Hz, and 2.5 K Hz.

13. The audio equalizer circuit of claim 10 wherein the plurality of parallel bandpass filters, the low frequency equalizer, the high frequency equalizer, the first compressor, first summation amplifier, the second compressor, and the second summation amplifier are located within a single housing.

14. The audio equalizer circuit of claim 10 where the second compressor includes a governor switch.

15. The audio equalizer circuit of claim 14 where the governor switch has at least two limit switches.

16. A method of digitally controlling and modifying an audio signal through software, the method comprising:
receiving an initial digital audio input;
dividing the initial digital audio input into a first plurality of digital audio signals, the first plurality of digital audio signals including a first digital audio signal, a second digital audio signal, and a third digital audio signal, wherein the first digital audio signal is a multipass signal, the second digital audio signal is a low frequency signal, and the third digital audio signal is a high frequency signal;
dividing the first digital audio signals into a second plurality of digital audio signals;
independently compressing at least one of the divided second plurality of digital audio signals separately from the remaining divided second plurality of digital audio signals;
summing the at least one independently compressed digital audio signal with the remaining divided second plurality of digital audio signals;
compressing the summed digital audio signal into a second compressed digital audio signal; and
summing the second compressed digital audio signal with the other of the first plurality of digital audio signal and with second and third digital audio signals such that the second summed signal is different than the initial digital audio signal.

17. The method of digitally controlling and modifying an audio signal of claim 16 wherein the computing device is a personal computer.

18. A method of claim 16 wherein the second plurality of digital audio signals includes,
a first divided digital audio signal having a centerline frequency of 2.5 k Hz;
a second divided digital audio signal having a centerline frequency of 640 Hz;
a third divided digital audio signal having a centerline frequency of 160 Hz;
a fourth divided digital audio signal having a centerline frequency of 40 Hz; and
a fifth divided digital audio signal having a centerline frequency of 10 Hz.

* * * * *